United States Patent
Wang et al.

(10) Patent No.: US 7,037,773 B2
(45) Date of Patent: May 2, 2006

(54) METHOD OF MANUFACTURING METAL-OXIDE-SEMICONDUCTOR TRANSISTOR

(75) Inventors: Yu-Ren Wang, Tainan (TW); Ying Yen, Tongsiao Township, Miaoli County (TW); Tony E T Liu, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 78 days.

(21) Appl. No.: 10/812,433

(22) Filed: Mar. 29, 2004

(65) Prior Publication Data

US 2005/0215019 A1 Sep. 29, 2005

(51) Int. Cl.
*H01L 21/8238* (2006.01)

(52) U.S. Cl. ............... 438/216; 438/287; 438/303; 438/305

(58) Field of Classification Search ........... 438/216, 438/287, 303, 305
See application file for complete search history.

(56) References Cited

U.S. PATENT DOCUMENTS

| | | | |
|---|---|---|---|
| 6,262,445 B1* | 7/2001 | Swanson et al. | 257/288 |
| 6,576,963 B1* | 6/2003 | Jin et al. | 257/388 |
| 6,579,770 B1* | 6/2003 | Rodder et al. | 438/300 |
| 6,713,360 B1* | 3/2004 | Jain et al. | 438/306 |
| 2003/0020111 A1* | 1/2003 | Bevan | 257/303 |
| 2003/0045048 A1* | 3/2003 | Marsh | 438/218 |
| 2003/0211697 A1* | 11/2003 | Hsu et al. | 438/305 |
| 2004/0137373 A1* | 7/2004 | Lei et al. | 430/313 |
| 2004/0266057 A1* | 12/2004 | Nagasawa | 438/105 |

\* cited by examiner

*Primary Examiner*—George Fourson
*Assistant Examiner*—Fernando L. Toledo
(74) *Attorney, Agent, or Firm*—J.C. Patents

(57) ABSTRACT

A method of manufacturing a metal-oxide-semiconductor transistor is provided. A substrate having a gate structure thereon is provided. A source/drain extension region is formed in the substrate on each side of the gate structure. Thereafter, a carbon-containing material layer is formed over the substrate and then the carbon-containing material layer is etched back to form spacers on the sidewalls of the gate structure. Finally, a source/drain region is formed in the substrate on each side of the spacer-coated gate structure.

20 Claims, 3 Drawing Sheets

METHOD OF MANUFACTURING METAL-OXIDE-SEMICONDUCTOR TRANSISTOR

BACKGROUND OF THE INVENTION

1. Field of the Invention

The present invention relates to a method of manufacturing a semiconductor device. More particularly, the present invention relates to a method of manufacturing a metal-oxide-semiconductor (MOS) transistor.

2. Description of the Related Art

At present, metal-oxide-semiconductor (MOS) transistor is one of the major electronic devices of a semiconductor device. In a MOS transistor, spacers on the sidewalls of a gate structure are often fabricated using a dielectric material. To fabricate silicon nitride spacers, silane or dichlorosilane are introduced into a reaction chamber and then heated so that the silane or dichlorosilane reacts with ammonia to form a silicon nitride layer over the substrate to cover the MOS transistor and the gate structure. Thereafter, the silicon nitride layer is etched to form spacers on each side of the gate structure. However, the aforementioned method of forming the silicon nitride layer has a high thermal budget and is rather unsuitable for fabricating the next generation of MOS transistor (having a line width 45/65 nm). Hence, another silicon nitride deposition process that uses hexachlorosilane (HCD) as a precursor material has been developed. Using HCD as a precursor material not only reduces overall thermal budget of the process, but also reduces the amount of hydrogen and produces a layer with a good step coverage and a low loading effect.

Nevertheless, using HCD as a precursor material to deposit a silicon nitride layer followed by etching to form spacers has one major disadvantage. When a pre-cleaning operation using a diluted hydrofluoric acid solution (0.01%) for a metal silicide process is carried out, the etching rate is almost 3 times of a silicon nitride layer formed by reacting silane with ammonia in a conventional rapid thermal chemical vapor deposition (RTCVD) process and almost 6 times of a silicon nitride layer formed by reacting dichlorosilane with ammonia in a conventional deposition process. In other words, the silicon nitride layer formed using HCD as a precursor material may encounter control problems in a pre-cleaning or other wet etching process. If the process is not monitored carefully, the silicon nitride spacers can be over-etched leading to a drop in device performance and/or production yield.

SUMMARY OF THE INVENTION

Accordingly, at least one objective of the present invention is to provide a method of manufacturing a metal-oxide-semiconductor (MOS) transistor capable of producing spacers with a greater wet etching resistance while maintaining a constant etching selectivity ratio relative to other films in a dry etching operation.

Another objective of the present invention is to provide a method of manufacturing a MOS transistor capable of reducing the sheet resistance of source/drain extension regions of the MOS transistor so that the source/drain extension regions can have an abrupt profile.

Another objective of the present invention is to provide a method of manufacturing a MOS transistor capable of reducing the out-diffusion of dopants in source/drain extension regions and source/drain regions of the MOS transistor so that transient enhanced diffusion effect is minimized.

To achieve these and other advantages and in accordance with the purpose of the invention, as embodied and broadly described herein, the invention provides a method of manufacturing a metal-oxide-semiconductor (MOS) transistor. First, a substrate having a gate structure thereon is provided. A source/drain extension region is formed in the substrate on each side of the gate structure. Thereafter, a carbon-containing material layer is formed over the substrate and then the carbon-containing material layer is etched back to form spacers on the sidewalls of the gate structure. Finally, a source/drain region is formed in the substrate on each side of the spacer-coated gate structure.

In one embodiment of the present invention, the carbon-containing material layer is formed by performing a deposition process. In the deposition process, hexachlorosilane (HCD) and ethylene ($C_2H_4$) are used as a precursor material to impregnate the material layer with carbon. In another embodiment of the present invention, the carbon-containing material layer is formed using bis(tert-butylamino)silane (BTBAS) as the precursor material.

According to another embodiment of the present invention, the carbon-containing material layer is formed by depositing a material layer over the substrate and then doping carbon ions into the material layer.

The method of manufacturing MOS transistor according to the present invention produces spacers with carbon atoms therein so that etching resistance of the spacers in a pre-cleaning operation of the metal silicide process or other wet etching operation is enhanced without affecting the etching selectivity ratio relative to other film layers in a dry etching operation.

Furthermore, the manufacturing process of the present invention produces a material layer and subsequently formed spacers with carbon. The carbon forms a barrier layer to the source/drain terminal on the surface of the substrate so that out-diffusion of dopants from the source/drain extension regions and the source/drain regions is minimized.

Because the spacers of the MOS transistor contains carbon, sheet resistance of the source/drain extension regions is reduced so that the source/drain extension regions can have an abrupt profile.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE PREFERRED EMBODIMENTS

Figure 1A:
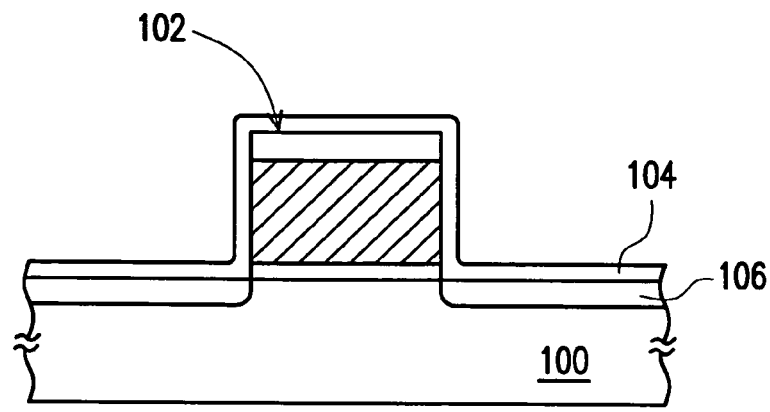
FIGS. 1A through 1C are schematic cross-sectional views showing the steps of fabricating a MOS transistor according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
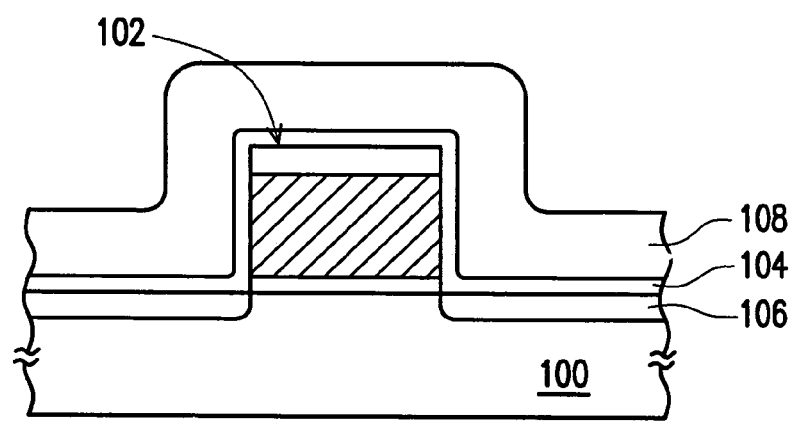
Figure 1C:
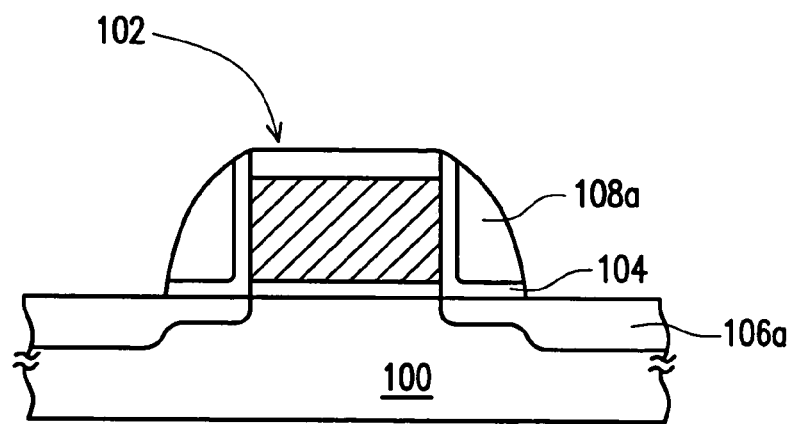

FIGS. 1A through 1C are schematic cross-sectional views showing the steps for fabricating a MOS transistor according to a first preferred embodiment of this invention. As shown in FIG. 1A, a substrate 100 having a gate structure 102 thereon is provided. The substrate 100 is a silicon substrate, for example. A source/drain extension region 106 is formed in the substrate 100 on each side of the gate structure 102. Thereafter, a conformal liner layer 104 is formed over the substrate 100. The liner layer 104 is a silicon oxide layer formed, for example, by performing a thermal oxidation or a chemical vapor deposition process. The source/drain extension regions 106 can be doped with N-type dopants or P-type dopants according to the conductive type of the device. To produce N-type source/drain extension regions, arsenic ions are commonly used. On the other hand, to produce P-type source/drain regions, boron fluoride ions are commonly used. The source/drain regions 106 are formed, for example, by performing an ion implantation such that ions are implanted into the substrate 100 on each side of the gate structure 102 using the gate structure 102 as a mask.

As shown in FIG. 1B, a carbon-containing material layer 108 is formed over the liner layer 104. The carbon-containing material layer 108 is a silicon nitride layer formed, for example, by performing a chemical vapor deposition process. To form the carbon-containing silicon nitride layer (the material layer 108), the substrate 100 is placed inside a reaction chamber (not shown) and then gaseous ammonia, nitrogen, ethylene and hexachlorosilane (HCD) are introduced into the reaction chamber so that the gases react with each other. The ethylene and the HCD serve as a precursor material in the silicon nitride deposition process.

In the chemical vapor deposition process, the pressure inside the reaction chamber is set to a value between 0.2 torr to 2.5 torr and the temperature is set to a temperature between 450° C. to 600° C., for example. In addition, the ratio between HCD and ammonia by volume is set to a value between 2.5% to 8%, for example. The flow rate of ethylene is set to a value between 100 sccm to 1200 sccm and the flow rate of nitrogen is set to a value between 300 sccm to 1800 sccm, for example. The flow rate of ammonia is preferably set to 180 sccm. The flow rate of HCD is set to a value between 12 sccm to 20 sccm, preferably at 15 sccm.

As shown in FIG. 1C, the carbon-containing material layer 108 is removed so that a spacer 108a is formed on the respective sidewalls of the gate structure 102. A portion of the carbon-containing material layer 108 can be removed, for example, by performing an anisotropic etching process to etch back the carbon-containing material layer 108. Thereafter, a source/drain region 106a is formed in the substrate 100 on each side of the spacer-coated gate structure 102. The source/drain regions 106a are formed, for example, by performing a heavy implantation of ions into the substrate 100 using the gate structure 102 and the spacers 108a as a mask. The dopants implanted into the substrate 100 can be N-type ions or P-type ions according to the conductive type of the device. If an N-type source/drain region 106a is required, phosphorus or arsenic ions are used in the implantation. On the other hand, if a P-type source/drain region 106a is required, boron or boron fluoride ions are used in the implantation. A metal-oxide-semiconductor (MOS) transistor is thus produced.

It should be noted that the carbon-containing material layer 108 shown in FIG. 1B can be fabricated by some other methods. In a second embodiment of the present invention, a nitride/oxide carbon-containing composite layer (not shown) is formed instead of a single carbon-containing material layer 108. To form the nitride/oxide carbon-containing composite layer, the substrate 100 is placed inside a reaction chamber and then gaseous oxygen, nitrogen, ammonia and bis(tert-butylamino)silane (BTBAS) are passed into the reaction chamber to perform a chemical vapor deposition process. The BTBAS serves as a precursor material in the nitride/oxide composite layer deposition.

In the chemical vapor deposition process, the pressure inside the reaction chamber is set to a value between 0.2 torr to 2.5 torr and the temperature is set to a temperature between 550° C. to 600° C., for example. In addition, the ratio between BTBAS and ammonia by volume is set to a value between 15% to 25% and the ratio between BTBAS and oxygen by volume is set to a value between 10% to 30%, for example. The flow rate nitrogen is set to a value between 110 sccm to 200 sccm and the flow rate of BTBAS is set to a value between 75 sccm to 110 sccm.

In the aforementioned embodiments, the precursor material in the chemical vapor deposition process has a high carbon content for forming a carbon-containing material layer over the substrate. However, aside from the two aforementioned deposition processes, the present invention also provides another method of manufacturing a MOS transistor equally capable of forming a carbon-containing material layer so that carbon-containing spacers can be subsequently formed.

Figure 2A:
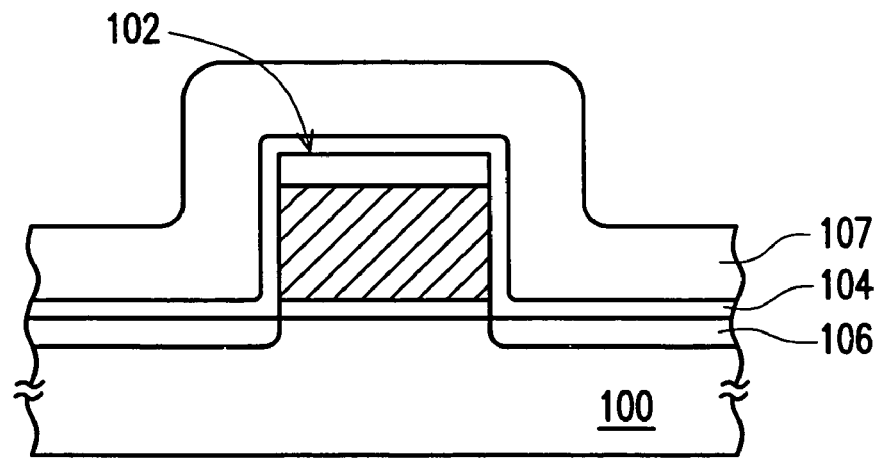
FIGS. 2A and 2B are schematic cross-sectional views showing the steps of fabricating a MOS transistor according to a third preferred embodiment of this invention.
Figure 2B:
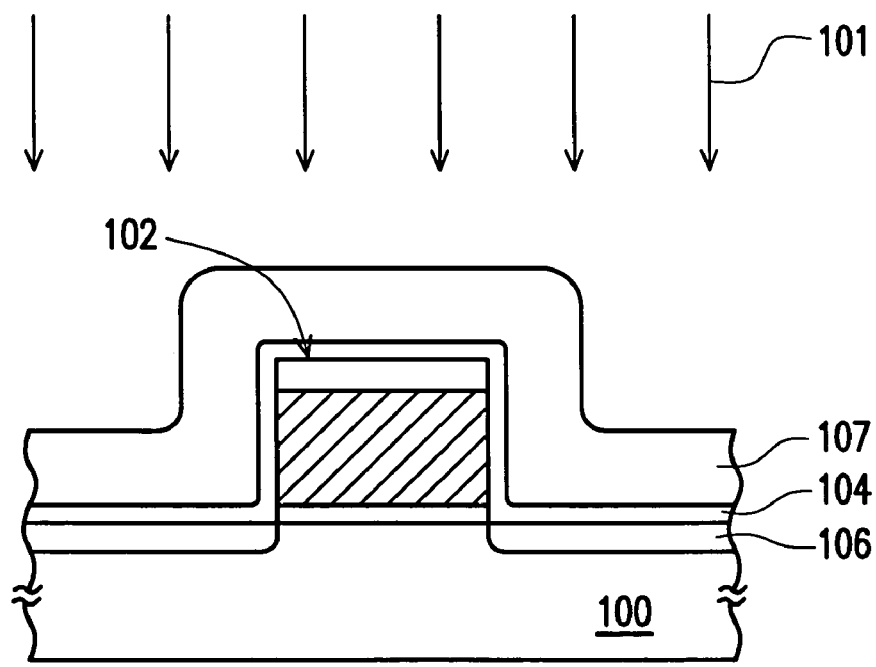

FIGS. 2A and 2B are schematic cross-sectional views showing the steps of fabricating a MOS transistor according to a third preferred embodiment of this invention. After forming the liner layer 104 as shown in the first embodiment, a material layer 107 is formed over the substrate 100 as shown in FIG. 2A. The material layer 107 is formed, for example, by placing the substrate 100 inside a reaction chamber and then introducing gaseous HCD, nitrogen and ammonia into the reaction chamber so that the gases react with each other to deposit silicon nitride over the substrate 100.

As shown in FIG. 2B, the carbon within the material layer 107 is formed by doping. For example, an ion implantation 101 is carried out to implant carbon ions into the material layer 107 to form a carbon-containing material layer 108.

Subsequent steps after forming the carbon-containing material layer 108 are identical to the one carried out in FIG. 1C in the first embodiment. Thus, description of the process is not repeated here.

In the first embodiment of the present invention, ethylene is also added to the conventional HCD precursor material so that both ethylene and HCD serve as a precursor material for forming the material layer. Hence, the process is able to reduce overall thermal budget through the HCD. Furthermore, using both HCD and ethylene as precursor materials for forming silicon nitride spacers increases etching resistance towards subsequent pre-cleaning or wet etching operations. In addition, the change will not affect the etching selectivity ratio between the material layer and other film layers in any dry etching operations.

Figure 3:
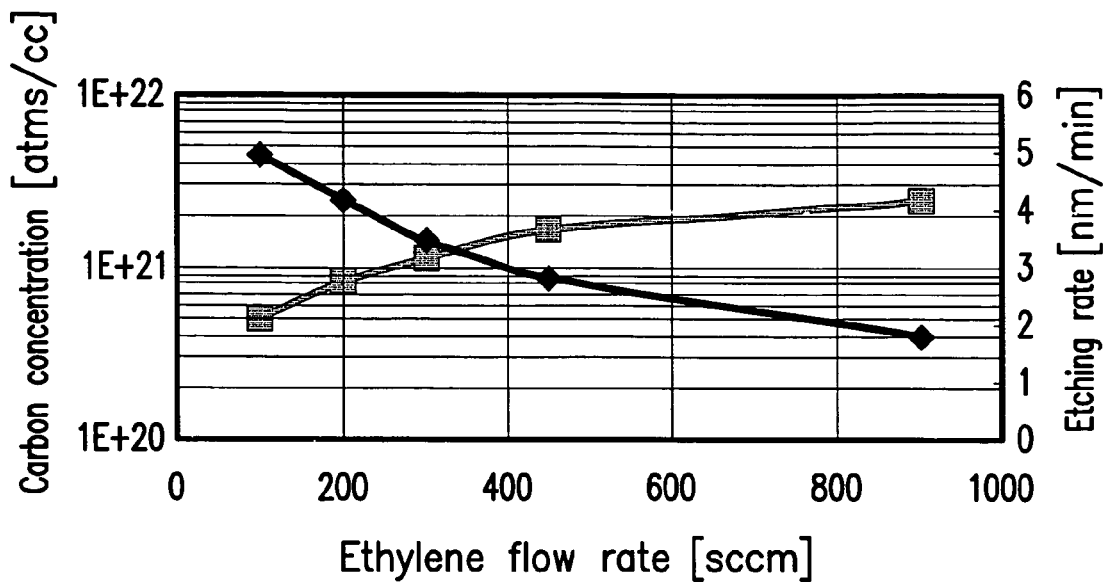
FIG. 3 is a graph showing characteristic properties of the silicon nitride spacers fabricated according to the first embodiment of this invention.

FIG. 3 is a graph showing characteristic properties of the silicon nitride spacers fabricated according to the first embodiment of this invention. As shown in FIG. 3, the horizontal axis indicates the flow rate of ethylene in the first embodiment, the right vertical axis indicates the concentration of carbon in the silicon nitride spacers and the left vertical axis indicates the etching rate of the silicon nitride spacers in a wet etching operation using hydrofluoric acid solution. The curve shown by the symbol ■ represents the relationship between the flow rate of ethylene and the concentration of carbon. According to the curve, the concentration of carbon inside the silicon nitride spacers is proportional to the ethylene flow rate.

In FIG. 3, the curve shown by the symbol ♦ represents the relationship between the ethylene flow rate and the etching rate of the silicon nitride spacers. According to the curve, the etching rate of the silicon nitride spacers is inversely proportional to the ethylene flow rate. In other words, the higher the amount of carbon inside the silicon nitride spacers, the lower will be the etching rate of the silicon nitride spacers in a wet etching operation. Hence, the present invention is capable of reducing the etching rate of silicon nitride spacers in a wet etching operation.

Figure 4:
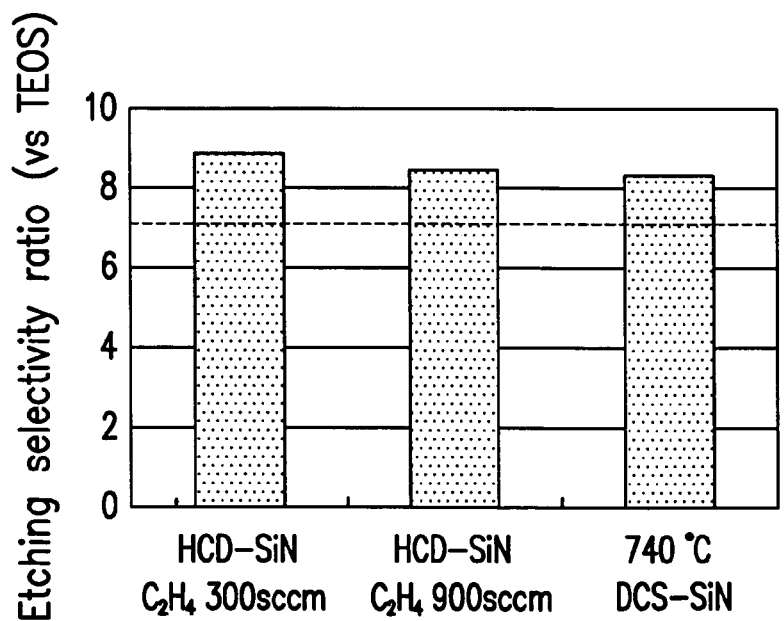
FIG. 4 is a bar chart showing the etching selectivity ratio in a dry etching operation between a silicon nitride spacer fabricated according to the first embodiment of this invention and a TEOS layer as well as a silicon nitride spacer formed by the conventional method and a TEOS layer.

FIG. 4 is a bar chart showing the etching selectivity ratio in a dry etching operation between a silicon nitride spacer fabricated according to the first embodiment of this invention and a TEOS layer as well as a silicon nitride spacer formed by the conventional method, and a TEOS layer. As shown in FIG. 4, the silicon nitride spacers formed using ethylene with a flow rate of 300 sccm or 900 sccm according to the first embodiment of the invention has an etching selectivity ratio relative to TEOS almost identical to conventional silicon nitride spacers formed using dichlorosilane. In other words, using ethylene and HCD as precursor materials in fabricating the silicon nitride spacers not only reduces the etching rate in a wet etching operation, but can also maintain a constant etching selectivity ratio between the silicon nitride spacers and other film layers in a dry etching operation.

Furthermore, the carbon atoms within the spacers formed by adding ethylene in the spacer fabrication process may diffuse into the junction area (the oxide/silicon interface) between the liner layer and the substrate to serve as a barrier layer for the source/drain terminal. Hence, the amount of dopants such as boron ions diffusing from the source/drain terminal towards deeper areas of the substrate and the sheet resistance of the source/drain extension regions are reduced. Moreover, the source/drain extension regions can have an abrupt profile. In particular, increasing the carbon content within the material layer can reduce the dielectric constant; therefore the material layer can be used as a dielectric material in a backend process.

The BTBAS serves as a precursor material in the material layer deposition process in the second embodiment and the implantation of carbon ions into the material layer changes the material layer into a carbon-containing material layer in the third embodiment of present invention. The carbon-containing spacers in the MOS transistor formed by either method similarly have the aforementioned advantages.

Table 1 below shows some experimental data on the depth of the source/drain extension regions in the substrate and associated sheet resistance between a MOS transistor formed by the first embodiment of present invention and the MOS transistor formed by the conventional process.

TABLE 1

| | Dopant Parameters | Spacer Parameters | Annealing Temperature (° C.) | Junction Depth (nm) | Sheet Resistance (Ohm/sq) |
|---|---|---|---|---|---|
| Condition (1) | $BF_2$, 1 KeV | $SiH_4$ + $NH_3$ | 1075 | 24 | 5050 |
| Condition (2) | $BF_2$, 1 KeV | HCD | 1075 | 24 | 4168 |
| Condition (3) | $BF_2$, 1 KeV | HCD + Ethylene (300 sccm) | 1075 | 24 | 1836 |
| Condition (4) | $BF_2$, 1 KeV | HCD + Ethylene (900 sccm) | 1075 | 24 | 1772 |

As shown in Table 1, the source/drain extension regions of the MOS transistor is formed by implanting $BF_2$ ions into the substrate at a concentration of about $1.5 \times 10^{15}$ atom/cm$^3$ and at an energy level of about 1 KeV for all the conditions listed from (1) to (4). In condition (1), the spacers are formed in a conventional reaction between silane and ammonia. In condition (2), HCD serves as a precursor material in the spacer deposition process. In condition (3) and (4), HCD and ethylene are used as the precursor materials. However, the flow rate of ethylene is 300 sccm in condition (3) while the flow rate of ethylene is 900 sccm in condition (4). According to the experimental results from Table 1, sheet resistance of the source/drain extension regions drops with an increase in the ethylene flow rate. Thus, using ethylene as a precursor material in the spacer deposition process can lower the sheet resistance of the source/drain extension regions and boost the electrical performance of the MOS transistor.

In the aforementioned embodiments, the fabrication of a typical MOS transistor is used in the illustration. However, the application of present invention can be applied to other MOS transistor fabrication processes. For example, the present invention can be applied to a MOS transistor fabrication process using a pre-amorphization implantation method. The aforementioned MOS transistor fabrication process at least comprises following steps: a pre-amorphization implantation process is performed to a substrate with a gate structure thereon to form an amorphized region in the substrate, a source/drain extension regions is formed in the amorphized region on each side of the gate structure, and then a carbon-containing spacer is formed on each sidewall of the gate structure, a source/drain regions is formed in the amorphized region on each side of the spacer-coated gate structure. Thereafter, a solid phase epitaxial process is carried out to form crystals in the amorphized region so that the dopants within the source/drain extension regions and the source/drain regions are activated to form the source/drain terminals.

In summary, the method of manufacturing a MOS transistor according to present invention has the following advantages:

1. The spacers in the MOS transistor has greater resistance against etching in pre-cleaning operation of a metal silicide process or other wet etching operation but can maintain almost identical etching selectivity ratio between the spacers and other film layers in dry etching operations.

2. Within the source/drain extension regions, the source/drain extension regions have a lower sheet resistance and an abrupt profile to boost the electrical performance of the device.

3. The carbon atoms within the material layer or subsequently formed spacers form a barrier layer at the surface of the substrate so that dopants diffusing out from the source/drain regions and the source/drain extension regions is greatly minimized.

4. The process of fabricating carbon-containing spacers according to the present invention has an equally low thermal budget as spacers formed using HCD in a conventional process.

5. Since a higher carbon content within the material layer reduces the dielectric constant of the material layer, the material layer can be used as a dielectric material in a backend process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a metal-oxide-semiconductor (MOS) transistor, comprising the steps of:
   providing a substrate having a gate structure thereon;
   forming a source/drain extension region in the substrate on each side of the gate structure;
   forming a carbon-containing material layer over the substrate wherein gases used to form the carbon-containing material layer comprises ethylene (C2H4), hexachlorosilane (HCD), ammonia and nitrogen;
   etching back the carbon-containing material layer to form a spacer on each sidewall of the gate structure; and
   forming a source/drain region in the substrate on each side of the spacer-coated gate structure.

2. The method of claim 1, wherein the step of forming the carbon-containing material layer comprises performing a chemical vapor deposition process.

3. The method of claim 1, wherein the flow rate of ethylene is set to a value between 100 sccm to 1200 sccm in the chemical vapor deposition process.

4. The method of claim 1, wherein the hexachlorosilane to ammonia ratio is set to a value between 2.5% to 8% by volume in the chemical vapor deposition process.

5. The method of claim 1, wherein the flow rate of hexachlorosilane is set to a value between 12 sccm to 20 sccm in the chemical vapor deposition process.

6. The method of claim 1, wherein the flow rate of nitrogen is set to a value between 300 sccm to 1800 sccm in the chemical vapor deposition process.

7. The method of claim 1, wherein the chemical vapor deposition process is carried out at a temperature between about 450° C. to 600° C.

8. The method of claim 1, wherein the chemical vapor deposition process is carried out at a pressure between 0.2 torr to 2.5 torr.

9. The method of claim 1, wherein before the step of forming the carbon-containing material over the substrate, further comprises forming an oxide liner layer over the substrate and the gate structure.

10. A method of manufacturing a metal-oxide-semiconductor (MOS) transistor, comprising the steps of:
    providing a substrate having a gate structure thereon;
    forming a source/drain extension region in the substrate on each side of the gate structure;
    forming a carbon-containing material layer over the substrate, wherein gases used to form the carbon-containing material layer comprises bis(tert-butylamino)silane (BTBAS), oxygen, ammonia and nitrogen;
    etching back the carbon-containing material layer to form a spacer on each sidewall of the gate structure; and
    forming a source/drain region in the substrate on each side of the spacer-coated gate structure.

11. The method of claim 10, wherein the flow rate of the bis(tert-butylamino)silane is set to a value between about 75 sccm to 110 sccm.

12. The method of claim 10, wherein the bis(tert-butylamino)silane to ammonia ratio is set to a value between 15% to 20% by volume in the chemical vapor deposition process.

13. The method of claim 10, wherein the bis(tert-butylamino)silane to oxygen ratio is set to a value between 10% to 30% by volume.

14. The method of claim 10, wherein the flow rate of nitrogen is set to a value between 110 sccm to 200 sccm.

15. The method of claim 10, wherein the chemical vapor deposition process is carried out at a temperature set between about 50° C. to 600° C.

16. The method of claim 10, wherein the chemical vapor deposition process is carried out at a pressure between 0.2 torr to 2.5 torr.

17. The method of claim 10, wherein before the step of forming the carbon-containing material over the substrate, further comprises forming an oxide liner layer over the substrate and the gate structure.

18. A method of manufacturing a metal-oxide-semiconductor (MOS) transistor, comprising the steps of:
    providing a substrate having a gate structure thereon;
    forming a source/drain extension region in the substrate on each side of the gate structure;
    forming material layer over the substrate; and
    performing an ion implantation to implant carbon ions into the material layer,
    etching back the carbon-containing material layer to form a spacer on each sidewall of the gate structure; and
    forming a source/drain region in the substrate on each side of the spacer-coated gate structure.

19. The method of claim 18, wherein the deposition process further comprises:
    placing the substrate inside a reaction chamber; and
    introducing gaseous hexachlorosilane, nitrogen and ammonia into the reaction chamber so that the gases react to deposit material onto the substrate.

20. The method of claim 18, wherein before the step of forming the carbon-containing material over the substrate, further comprises forming an oxide liner layer over the substrate and the gate structure.

* * * * *